United States Patent
Geismar et al.

(10) Patent No.: US 7,089,076 B2
(45) Date of Patent: Aug. 8, 2006

(54) SCHEDULING MULTI-ROBOT PROCESSING SYSTEMS

(75) Inventors: H. Neil Geismar, Dallas, TX (US); Chelliah Sriskandarajah, Plano, TX (US); Natarajan Ramanan, Plano, TX (US)

(73) Assignee: FSI International, Inc., Chaska, MN (US)

( * ) Notice: Subject to any disclaimer, the term of this patent is extended or adjusted under 35 U.S.C. 154(b) by 336 days.

(21) Appl. No.: 10/439,954

(22) Filed: May 16, 2003

(65) Prior Publication Data

US 2004/0230334 A1 Nov. 18, 2004

(51) Int. Cl.
*G06F 19/00* (2006.01)

(52) U.S. Cl. .................. 700/121; 700/100; 700/112; 700/228

(58) Field of Classification Search ............ 700/95, 700/100, 112, 113, 117, 121, 228; 438/14
See application file for complete search history.

(56) References Cited

U.S. PATENT DOCUMENTS

| | | | | |
|---|---|---|---|---|
| 5,399,531 A | * | 3/1995 | Wu | 700/121 |
| 6,074,443 A | | 6/2000 | Venkatesh et al. | 364/468 |
| 6,546,307 B1 | * | 4/2003 | Hsiao | 700/121 |

FOREIGN PATENT DOCUMENTS

EP  0 837 494 A2  4/1998

OTHER PUBLICATIONS

Notification of PCT International Search Report, Sep. 6, 2004.

* cited by examiner

*Primary Examiner*—Leo Picard
*Assistant Examiner*—Charles Kasenge
(74) *Attorney, Agent, or Firm*—Baker Botts L.L.P.

(57) ABSTRACT

A robotic manufacturing system may include multiple robots for transporting materials between a series of stages in a manufacturing process. To provide enhanced efficiency, each of these robots may independently operate according to a reverse process flow, cyclical schedule of operation.

20 Claims, 2 Drawing Sheets

1

SCHEDULING MULTI-ROBOT PROCESSING SYSTEMS

TECHNICAL FIELD OF THE INVENTION

The present invention relates generally to processing systems and, more particularly, to scheduling of multi-robot processing systems.

BACKGROUND OF THE INVENTION

Modern manufacturing systems often use robots to automate processes. These robotic systems can provide a number of benefits, such as increased production and precision. In semiconductor manufacturing, robotic systems enable the fabrication of sophisticated electronic devices. Because of the costs associated with semiconductor manufacturing systems and the value of the resulting products, a key goal of these systems is the maximization of throughput.

SUMMARY OF THE INVENTION

In accordance with the present invention, techniques for scheduling multiple robot processing systems are provided. According to particular embodiments, these techniques increase throughput of robotic systems in comparison with other techniques.

According to a particular embodiment, a manufacturing system for processing semiconductor wafers includes an input buffer for holding wafers for processing in the system, an output buffer for holding wafers processed in the system, and multiple stages each operable to perform processing for a step in a sequence for processing wafers, each of the stages having one or more stations each operable to perform the processing for the stage the system also includes a plurality of robots for transporting wafers between the stages, the input buffer and the output buffer, each robot having assigned ones of the stages and operable to service the stages according to a deterministic schedule that services the assigned stages in reverse of the sequence of steps.

Embodiments of the invention provide various technical advantages. These techniques, when appropriately implemented, can enhance productivity of robotic systems. Due to the high value of fabricated wafers, even very small improvements in average process times can greatly increase profitability over time. Moreover, certain embodiments provide for controlling multi-robot systems to prevent collisions between the robots. This prevents costly damage to robots and/or materials in process.

Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE DRAWINGS

Figure 1:
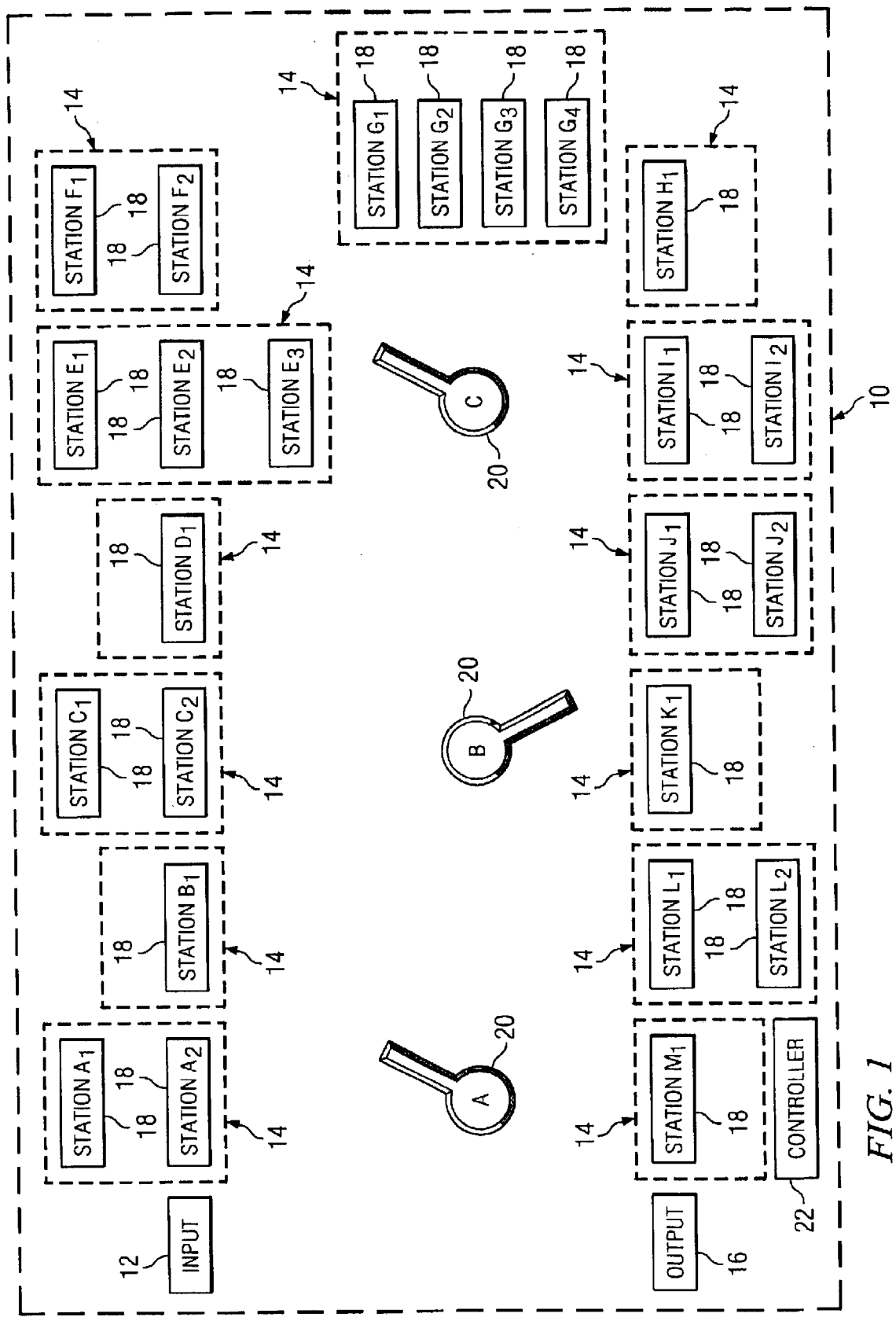
FIG. 1 illustrates a manufacturing system that includes a robotic cell and a controller operating in accordance with particular embodiments of the present invention.

FIG. 1 illustrates a manufacturing system 10 having an input buffer 12, multiple processing stages 14, and an output buffer 16. System 10 also includes multiple robots 20 for transporting materials between input 12, stages 14, and output 16. In the embodiment illustrated, system 10 includes a controller 22 for configuring and handling communication between robots 20. In general, system 10 processes materials using the series of stages 14, with robots 20 shuffling the materials between stages 14. According to particular embodiments, each robot 20 uses a determined schedule to service one or more stages 14. For example, each robot 20 may follow a counter process loading algorithm in which robot 20 loads each empty stage 14 as soon as possible, while servicing each stage 14 in reverse order to the process flow. Because the scheduling algorithms described with respect to these concepts are useful in processing systems handling the manufacture of semiconductor wafers, the following discussions will focus primarily on this application. However, it should be understood that the disclosed techniques may be applicable and useful in any number of robotic manufacturing systems.

In the embodiment illustrated, system 10 includes a thirteen-stage manufacturing process, with input 12 for holding unprocessed wafers, and output 16 for holding completed wafers. Each stage 14 includes one or more stations 18, each capable of independently performing the processing for that stage 14. Thus, system contemplates stages 14 having parallel stations 18. This enables system designers to include parallel processing stations 18 to prevent bottlenecks. For example, consider a two-stage system in which the second stage takes twice as long as the first stage. In this circumstance, the use of two parallel stations within the second stage can help prevent bottlenecks caused by different processing times. In this diagram, stages 14 are assigned labels A–M, with stations 18 within each stage 14 labeled accordingly. Thus, for example, stage A includes station $A_1$ and station $A_2$. For this illustration, it is assumed that the manufacturing process begins at stage A and proceeds through consecutive letters through stage M.

Within each stage 14, each station 18 accommodates loading and unloading of materials, such as semiconductor wafers being processed. Thus, for example, one of robots 20 may handle loading and unloading for one or more stations 18. However, in a multiple robot processing system, such as the embodiment illustrated, some stages 14 and/or stations 18 may be loaded and/or unloaded by more than one robot 20. Thus, for example, one robot 20 may be assigned to load stations $C_1$ and $C_2$, while another robot 20 is assigned to unload these stations. These stages 14 with multiple assigned robots 20 may be referred to as shared stages. In many aspects, input 12 and output 16 may be treated by robots 20 as additional stages 14. However, input 12 may require only unloading, and similarly, output 16 may only require loading by robots 20.

In the embodiment illustrated, system 10 includes three robots 20 that perform material handling functions including loading, unloading, and transporting wafers between physical locations. Each of these robots 20 represents any suitable mechanical apparatus, including any appropriate controlling logic, that can operate to transport materials. In the illustration, the three robots 20 are labeled A, B, and C.

These robots provide for the movement of materials from input 12, through stages 14, and into output 16.

According to particular embodiments, each robot 20 is assigned particular stages 14 to load and particular stages 14 to unload. For the purposes of this discussion, assume the following assignments: Robot A unloads input 12, stage A, stage L, and stage M. Robot A also loads stage A, stage B, stage M, and output 16. Robot B unloads stations B, C, D, I, J, and K. Robot B also loads stations C, D, E, J, K, and L. Robot C unloads stations E, F, G, and H. Robot C also loads stations F, G, H, and I.

This robot assignment provides for four shared stages 14, including stage B, stage E, stage I, and stage L. In each of these shared stages 14, one robot 20 loads while another robot 20 unloads. Thus, for example, robot A loads stage B, while robot B unloads stage B. As should be apparent, while input 12 and output 16 are not necessarily processing stages, robot A may treat these similar to shared stages. Thus during processing, robot A may treat input 12 as a stage assigned for unloading and treat output 16 as a stage assigned for loading.

During operation, robots 20 may operate according to any number of servicing algorithms to move wafers through system 10. To maximize throughput of system 10, designers attempt to make the servicing algorithm used as effective as possible. To provide efficiency, these servicing algorithms often attempt to minimize any idle time within elements of system 10. Because even small increases in throughput can dramatically increase cost effectiveness of system 10, researchers have devoted substantial time and expense to develop efficient servicing algorithms. However, the number of potential movements of robots 20 within system 10 is virtually endless. Therefore, finding and identifying efficient scheduling algorithms remains extremely difficult.

One class of scheduling algorithms that has been proposed provides for dynamic control of the movements of robots 20. According to these algorithms, robots 20 determine their operations according to the current state of system 10. For example, robots 20 may dynamically identify stations 18 to service based on information such as the times that stations 18 have been waiting to be serviced. Because dynamic algorithms can respond to current and changing conditions within system 10, many researchers feel that these types of algorithms provide the most promise for optimizing throughput in robotic manufacturing systems. Even so, however, current dynamic scheduling algorithms are in many cases far from optimal.

Deterministic scheduling algorithms, as opposed to dynamic scheduling algorithms, provide for a predetermined series of operations to be performed by robots in a manufacturing process. When operating according to a deterministic scheduling algorithm, robots 20 may be forced to occasionally introduce delays while waiting on processing within stations 18. For example, consider robot 10 operating according to a schedule in which the next operation requires robot A to unload station $M_1$ and move the wafer into output 16. Until station $M_1$ finishes processing of the wafer, robot 50 waits before performing the scheduled operation.

According to particular embodiments, robots 20 within system 10 use deterministic scheduling algorithms in which each robot 20 operates according to a cyclical schedule. In particular, robots 20 may each implement a cyclical scheduling algorithm in which each cycle sets forth a predetermined series of operations. Thus, after some initial startup period, robots 20 each repeat a cycle of operations over and over. At the beginning and end of each cycle, system 10 will be in the same state. That is, each station 18 that was "occupied" by a wafer at the beginning of the cycle will be occupied by a wafer at the end of the cycle. By repeating the cycle of operations, robots 20 maintain system 10 in steady state operations, in which a predetermined number of wafers are moved through system 10 with each cycle. According to particular embodiments, robots 20 each operate according to a deterministic schedule that services assigned stages 14 in a counter process flow, load-as-soon-as-possible ordering. To demonstrate the operation of this scheduling algorithm, reference is now made to FIG. 2, which illustrates a simpler manufacturing process.

Figure 2:
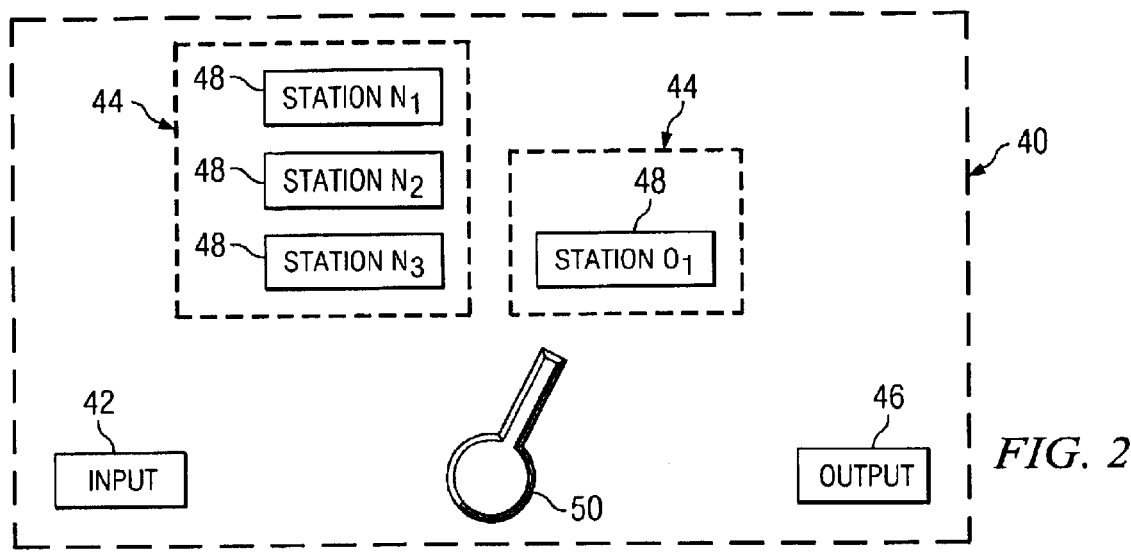
FIG. 2 illustrates a manufacturing system that includes a robotic cell having a single robot operating in accordance with particular embodiments.

FIG. 2 illustrates a manufacturing system 40 that, like system 10, includes an input buffer 42, multiple stages 44, and an output buffer 46. Each stage 44 may include one or more stations 48. A robot 50 provides for transportation of materials from input 42 between stages 44 and into output 46. In the embodiment illustrated, system 40 is a two-stage process, with the stages assigned labels of N and O. Thus, for example, consider system 40 receiving a wafer at input 42 for processing. To begin the processing, robot 50 unloads the wafer from input 42 and then loads the wafer into one of stations N. Once the wafer finishes processing within station N, robot 50 may unload the wafer from that station and then load the wafer into station O. Once processing of the wafer is completed within station O, robot 50 may unload the wafer from station O and then load the wafer into output 46. At this point, the wafer has finished processing through system 40. However, while this example illustrates only a single wafer moving through system 40, system 40 may simultaneously operate upon multiple wafers. Thus at some point, multiple stations 48 may be occupied by at least one wafer, in which those stations 48 may be loaded, processing, and/or ready for unloading.

As noted above, robot 50 may operate according to a deterministic scheduling algorithm in which robot 50 services stages 44 in a counter process flow, load-as-soon-as-possible ordering. For this type of operation, system 40 may first go through a startup period in which wafers begin flowing through the process. For example, consider system 40 in which all stations 48 are empty. Robot 50 may execute a series of operations during a startup period to move system 40 into an appropriate state. After the initial startup period, system 40 may be characterized by steady state operations, given the appropriate scheduling of robot 50. To provide steady state operations, robot 50 performs a cycle of operations that begins and ends with system 40 in the same condition. For example, consider the state of system 40 with all stations 48 having a loaded wafer. During one cycle, robot 50 may perform a series of operations to move wafers through system 40 that, when completed, leaves all stations 48 once again occupied with a wafer.

To provide for counter process flow operations, robot 50 services each stage 44 in reverse order of process flow in a round-robin fashion. For those stages 44 with multiple stations 48, robot 50 services one of these stations 48 with each pass through stages 44. To demonstrate the operation of this algorithm, consider system 40 in a state in which all stations 48 are currently occupied by wafers. As a first operation, robot 50 unloads station O and moves the wafer into output 46. Robot 50 then loads station O as soon as possible. Thus, as soon as a wafer is available from one of the stations 48 within stage N, robot 50 retrieves that wafer and loads stage O. At this point, one of the stations N within stage N is empty. Thus, robot 50 retrieves a wafer from input 42 and loads this wafer into the empty station N.

At this point, all stations 48 within system 40 are once again loaded with wafers. However, because stage N includes multiple parallel stations 48, this may be considered a different state than the original. For example, while the first pass of robot 50 through stages 44 may service station $O_1$ and station $N_1$, the next pass of robot 50 may service station $O_1$ and station $N_2$. Similarly, the third pass of robot 50 through stages 44 may service station $O_1$ and station $N_3$. At this point, system 40 may be considered to have returned to the initial state. Thus, for this example, in one cycle of robot 50 operating according to the counter process scheduling algorithm, robot 50 makes three passes through stages 44, servicing stages 44 in reverse order to the manufacturing process. This cycle of operations will produce three finished wafers in output 46.

It should be noted that the cycle provided by this scheduling algorithm will result in processing of a number of products according to the number of parallel stations 48 within stages 44. This number will be equal to the least common multiple based upon the number of stations 48 within each stage 44. In the embodiment illustrated, stage N includes three stations 48 while stage O includes one station 48. Thus, the least common multiple is three. If, for example, stage N included three stations 48 and station O included two stations 48, the least common multiple would be six. In this circumstance, robot 50 would perform a cycle of operations that would result in movement of six processed wafers into output 46. While operating according to the counter process scheduling algorithm, each cycle of robot 50 will produce this least common multiple number of wafers.

Referring again to FIG. 1, this system 10 includes a more complex arrangement of stages 14 and robots 20. Within system 10, each robot 20 may operate according to its own schedule for servicing its assigned stages 14. According to particular embodiments, each robot 20 operates according to a deterministic, counter process schedule for servicing its assigned stages 14. That is, each robot 20 will work against process flow to service its assigned stages 14. Therefore, robot A will attempt to load wafers in the round-robin order of output 16, stage M, stage B, and stage A. Similarly, robot B will attempt to load in the round-robin order of stage L, stage K, stage J, stage E, stage D, and stage C. Robot C will attempt to load in the round-robin order of stage I, stage H, stage G, stage F, and stage E.

In operating according to this scheduling algorithm, each robot 20 will perform a cycle of operations governed by the least common multiple as discussed above. Therefore, robot A will perform a cycle having two passes through assigned stages 14, robot B will perform a cycle having six passes through its assigned stages 14, and robot C will perform a cycle having twelve passes through its assigned stages 14. While each robot 20 thus operates according to its own counter process schedule, the resulting cycle of system 10 can provide for higher throughput of finished wafers when compared with existing techniques.

To provide configurations of various elements within system 10, such as configurations of the assignments and scheduling for robots 20, system 10 includes controller 22. Controller 22 may provide for automatic and/or manual configurations of operations within system 10. Thus, for example, controller 22 may represent any suitable central computer or processing device for communicating with other elements of system 10 and interacting with users or system administrators. According to particular embodiments, controller 22 initially provides for assignment of loading and unloading responsibilities among robots 20. Thus, either automatically or in response to commands from a user, controller 22 divides the loading and unloading responsibilities within system 10 among robots 20. Controller 22 may then determine the particular cycle for each robot 20 to implement a deterministic, counter process scheduling algorithm. Controller 22 can then configure each robot 20 to operate according to its particular schedule. This provides each robot 20 with a predetermined series of operations for each cycle.

Because some of stages 14 are shared between more than one robot 20, these physical locations may present opportunities for collisions between robots 20. These collisions could result in costly damage to both robots and the products being manufactured within system 10. Thus to prevent these collisions, system 10 may implement one or more schemes for inter-robot communication. These schemes enable each robot 20 to identify and avoid potential collisions.

According to particular embodiments, robots 20 use a central communication platform, such as controller 22 to avoid collisions. One such anti-collision scheme involves the use of tokens. According to this scheme, each shared stage 14 has an associated token that grants permission to move into physical proximity with that stage 14. Whenever robot 20 wishes to load or unload from that stage 14, robot 20 must control the associated token. If that token is unavailable, robot 20 must wait until the token becomes available. For example, consider stage B, which is loaded by robot A and unloaded by robot B. At some point, robot A may request and receive the token for stage B. If robot B wishes to unload stage B, robot B must wait until robot A releases the token for stage B.

Another collision prevention scheme contemplates communication of physical location information between robots 20. According to this scheme, each robot 20 can track the current location of each other robot 20, and thus can avoid potential collision. For example, each robot 20 may continuously update its current physical location within a shared component, such as controller 22. When determining movements, each robot may then access this information to identify and avoid potential collisions.

These example schemes provide two techniques for robots 20 to avoid potential collisions. However, these techniques are provided only as examples, and system 10 contemplates robots 20 using any suitable techniques for identifying and avoiding potential collisions. Moreover, the techniques used may be tailored to address the particular types of collisions that are physically possible within system 10. Thus, for example, if some shared stages 14 can be loaded and unloaded simultaneously, an anti-collision scheme need not prevent robots 20 from simultaneously accessing this stage 14.

It should be understood that system 10 and system 40 are provided as examples of robotic manufacturing systems that may benefit from implementing scheduling algorithms similar to those described above. However, while these systems are illustrated as including particular elements configured in a specific manner, the techniques described are appropriate for use in virtually any robotic manufacturing process.

Figure 3:
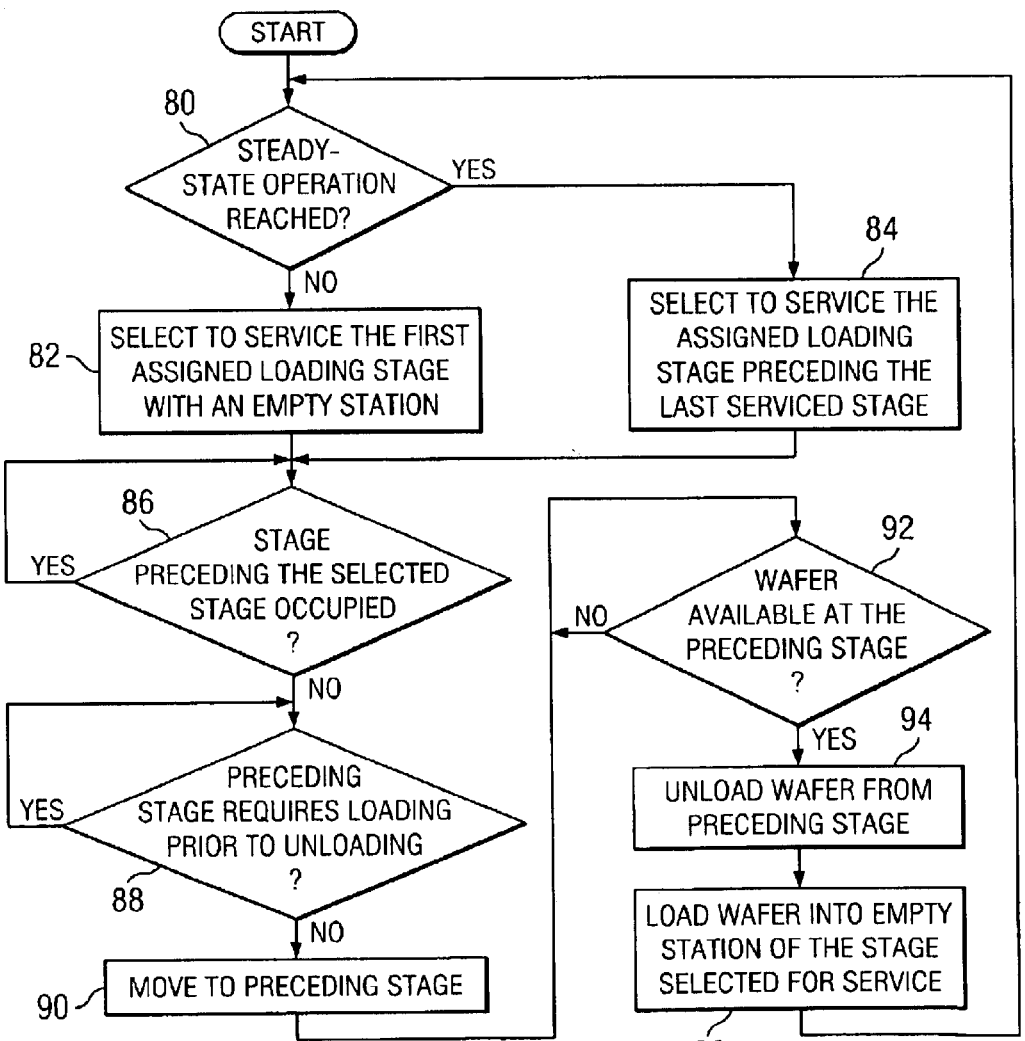
FIG. 3 is a flowchart illustrating a method for a robot in a manufacturing system to service multiple stages in a manufacturing process.

FIG. 3 is a flowchart illustrating a method for robot 20 to service assigned stages 14 to accomplish a reverse process flow, cyclical scheduling algorithm. According to the scheduling algorithm depicted, system 10 initially passes through a startup period until steady state operations are possible. Thus in the method illustrated, robot 20 determines whether steady state operation has been reached at step 80. If not, robot 20 may identify its assigned loading stages 14 and select to service the first assigned loading stage 14 with an empty station 18 at step 82. For example, robot A may examine its assigned stations 18 (which include stations 18 at stages A, B, and M) and determine the first one of these stages 14 having an empty station 18. Robot 20 can then select to load this empty station 18.

If, however, robot 20 determines that steady state operations have been reached at step 80, robot 20 selects to service its assigned loading stage 14 preceding the last serviced stage 14 at step 84. For example, if robot A last loaded station $B_1$, robot A will then select to service one of stations $A_1$ and $A_2$. To select the particular one of the parallel stations 18 to load, robot A may use any suitable techniques. According to particular embodiments, robot 20 services parallel stations 18 in a round-robin fashion.

After selecting a stage 14 to service, robot 20 then determines whether the immediately proceeding stage 14 is occupied by another robot 20 at step 86. In this step, robot 20 determines whether there will be a potential collision if it moves to the immediately proceeding stage 14. If the preceding stage is not occupied, robot 20 determines whether the proceeding stage requires loading prior to unloading at step 88. In this step, robot 20 attempts to prevent gridlock at shared stages 14. For example, consider shared stage B in a currently unloaded state. If robot B moves into stage B and waits for a finished wafer, robot A may be unable to load stage B. In this circumstance, robot B would effectively lock up the manufacturing process. Thus, by implementing step 88, robot 20 attempts to prevent such deadlocks.

If cleared to move to the preceding stage, robot 20 moves to the preceding stage at step 90. Robot 20 then waits for a wafer to become available at that stage. To accomplish this wait, robot 20 monitors for wafer availability at step 92. Once a wafer becomes available, robot 20 unloads the available wafer from the preceding stage 14 at step 94, and then loads the wafer into the empty station 18 at step 96. Robot 20 then selects the next stage 14 to service based either upon startup operation or cyclical, steady state operations.

Therefore, the illustrated flowchart provides an exemplary method of operation for robot 20 to service assigned stages 14 to provide a counter process flow, cyclical schedule of operation. However, the illustrated flowchart provides only an exemplary method of operation, and system 10 contemplates robots 20 using any suitable techniques for providing reverse process flow, cyclical scheduling. Therefore system 10 contemplates robots 20 using methods with additional steps, fewer steps and/or different steps, so long as the methods remain appropriate. For example, while a particular technique for operating during startup is detailed, system contemplates robots 20 implementing any suitable methods for operating to reach a steady state condition. Also, system 10 contemplates robots 20 implementing these techniques using any suitable centralization and/or distribution of functionality, and implementing that functionality using any appropriate combination of hardware and logic, such as software encoded in media. In addition, while the scheduling algorithm used by robots 20 may provide for an "predetermined" series of operations, it should be understood that robots 20 need not be aware of this characteristic of the scheduling algorithm. For example, robots 20 may use dynamic determinations, such as tracking the currently selected stage 14 and always moving to service the preceding stage 14, which may result in the deterministic cycle of operations.

Although the present invention has been described in several embodiments, a myriad of changes and modifications may be suggested to one skilled in the art, and it is intended that the present invention encompass such changes and modifications as fall within the scope of the present appended claims.

What is claimed is:

1. A manufacturing system for processing semiconductor wafers comprising:
    an input buffer for holding wafers for processing in the system;
    a plurality of stages each operable to perform processing for a step in a sequence for processing wafers, each of the stages having one or more stations each operable to perform the processing for the stage;
    an output buffer for holding wafers processed in the system; and
    a plurality of robots for transporting wafers between the stages, the input buffer and the output buffer, each robot having assigned ones of the stages and operable to service the stages according to a deterministic schedule that services the assigned stages in reverse of the sequence of steps.

2. The system of claim 1, wherein at least one of the stages is a shared stage, in which a first one of the robots is assigned to load all of the stations of the shared stage and a second one of the robots is assigned to unload all of the stations of the shared stage.

3. The system of claim 2, wherein the first robot, before moving into physical proximity of the shared stage, determines whether movement into the physical proximity of the shared stage will potentially result in a collision with the second robot.

4. The system of claim 1, wherein, for each robot, the schedule according to which the robot operates provides for a least common multiple cycle having a predetermined series of operations for the robot.

5. The system of claim 1, wherein for each of the stages having more than one station, the robot assigned to load the stage loads the stations in round-robin fashion that rotates the station loaded during each consecutive pass of the assigned robot in reverse order to the sequence.

6. The system of claim 1, further comprising a controller operable to assign each of the robots to selected ones of the stages, to assign at least one of the robots to the input buffer, and to assign at least one of the robots to the output buffer.

7. The system of claim 6, wherein the controller is further operable to communicate with each of the robots during operation of the system and to prevent collisions between the robots.

8. A method for processing semiconductor wafers in a multiple robot manufacturing system, the method comprising:
    identifying a plurality of stages each operable to perform processing for a step in a sequence for processing wafers, each of the stages having one or more stations each operable to perform the processing for the stage;
    identifying a plurality of robots for transporting wafers between the stages;
    assigning each of the robots to load selected ones of the stages;
    assigning each of the robots to unload selected ones of the stages;
    operating each of the robots according to a deterministic schedule that services the assigned stages for the robot in reverse of the sequence of steps.

9. The method of claim 8, wherein at least one of the stages is a shared stage, the method further comprising assigning a first one of the robots to load all of the stations of the shared stage and assigning a second one of the robots to unload all of the stations of the shared stage.

10. The method of claim 9, further comprising, before moving the first robot into physical proximity of the shared stage, determining whether movement into the physical proximity of the shared stage will potentially result in a collision between the first robot and the second robot.

11. The method of claim 8, wherein, for each robot, the schedule according to which the robot operates provides for a least common multiple cycle having a predetermined series of operations for the robot.

12. The method of claim 11, wherein for each of the stages having more than one station, the deterministic schedule for the robot assigned to load the stage provides for loading the stations in round-robin fashion that rotates the station loaded during each consecutive pass of the assigned robot in reverse order to the sequence.

13. The method of claim 8, further comprising assigning at least one of the robots to unload an input buffer and assigning at least one of the robots to load an output buffer.

14. Logic for processing semiconductor wafers in a multiple robot manufacturing system, the logic encoded in media and operable when executed to perform the steps of:
identifying a plurality of stages each operable to perform processing for a step in a sequence for processing wafers, each of the stages having one or more stations each operable to perform the processing for the stage;
identifying a plurality of robots for transporting wafers between the stages;
assigning each of the robots to load selected ones of the stages;
assigning each of the robots to unload selected ones of the stages;
operating each of the robots according to a deterministic schedule that services the assigned stages for the robot in reverse of the sequence of steps.

15. The logic of claim 14, wherein at least one of the stages is a shared stage, the logic further operable to assign a first one of the robots to load all of the stations of the shared stage and to assign a second one of the robots to unload all of the stations of the shared stage.

16. The logic of claim 15, further operable, before moving the first robot into physical proximity of the shared stage, to determine whether movement into the physical proximity of the shared stage will potentially result in a collision between the first robot and the second robot.

17. The logic of claim 14, wherein, for each robot, the schedule according to which the robot operates provides for a least common multiple cycle having a predetermined series of operations for the robot.

18. The logic of claim 17, wherein for each of the stages having more than one station, the deterministic schedule for the robot assigned to load the stage provides for loading the stations in round-robin fashion that rotates the station loaded during each consecutive pass of the assigned robot in reverse order to the sequence.

19. The logic of claim 14, further operable to assign at least one of the robots to unload an input buffer and to assign at least one of the robots to load an output buffer.

20. A manufacturing system for processing semiconductor wafers comprising:
means for applying a plurality of stages each operable to perform processing for a step in a sequence for processing wafers, each of the stages having one or more stations each operable to perform the processing for the stage;
means for identifying a plurality of robots for transporting wafers between the stages;
means for assigning each of the robots to load selected ones of the stages;
means for assigning each of the robots to unload selected ones of the stages; means for operating each of the robots according to a deterministic schedule that services the assigned stages for the robot in reverse of the sequence of steps.

* * * * *

UNITED STATES PATENT AND TRADEMARK OFFICE
CERTIFICATE OF CORRECTION

PATENT NO. : 7,089,076 B2  Page 1 of 1
APPLICATION NO. : 10/439954
DATED : August 8, 2006
INVENTOR(S) : H. Neil Geismar, Chelliah Sriskandarajah and Natarajan Ramanan It is certified that error appears in the above-identified patent and that said Letters Patent is hereby corrected as shown below:

Column 1,
Line 34, delete "stage the" and insert in place thereof --stage. The--.

Column 2,
Line 33, delete "system" and insert in place thereof --system 10--.

Column 7,
Line 48, delete "system" and insert in place thereof --system 10--.

Column 10,
Claim 20, Line 24, delete "applying" and insert in place thereof --identifying--.

Signed and Sealed this

Twenty-sixth Day of February, 2008

JON W. DUDAS
*Director of the United States Patent and Trademark Office*